(12) United States Patent
Sugawara

(10) Patent No.: US 9,705,528 B2
(45) Date of Patent: Jul. 11, 2017

(54) MEASUREMENT METHOD AND MEASUREMENT UNIT FOR DELTA-SIGMA TYPE DATA CONVERTER

(71) Applicant: Mitsutoshi Sugawara, Yokohama (JP)

(72) Inventor: Mitsutoshi Sugawara, Yokohama (JP)

( * ) Notice: Subject to any disclaimer, the term of this patent is extended or adjusted under 35 U.S.C. 154(b) by 0 days.

(21) Appl. No.: 14/392,047

(22) PCT Filed: Oct. 13, 2013

(86) PCT No.: PCT/JP2013/077868
§ 371 (c)(1),
(2) Date: May 13, 2015

(87) PCT Pub. No.: WO2014/077070
PCT Pub. Date: May 22, 2014

(65) Prior Publication Data
US 2015/0318866 A1    Nov. 5, 2015

(30) Foreign Application Priority Data
Nov. 16, 2012    (JP) .................... 2012-252602

(51) Int. Cl.
*H03M 13/00*    (2006.01)
*H03M 3/00*    (2006.01)

(52) U.S. Cl.
CPC .............. *H03M 13/00* (2013.01); *H03M 3/30* (2013.01); *H03M 3/378* (2013.01)

(58) Field of Classification Search
CPC ........ H03M 1/46; H03M 1/123; H03M 1/128; H03M 3/30; H03M 3/378; H03M 13/00
(Continued)

(56) References Cited

U.S. PATENT DOCUMENTS 5,781,142 A * 7/1998 Onodera ................. H03M 1/56
341/128
5,963,605 A * 10/1999 Yasui .................... H04J 3/0608
370/512
(Continued)

FOREIGN PATENT DOCUMENTS

JP    P61-137429 A    6/1986
JP    11004277 A *    1/1999 ............... H04L 1/00
(Continued)

OTHER PUBLICATIONS

Joey Doemberg, et al., "Full-Speed Testing of A/D Converters", IEEE Journal of Solid-State Circuits, 1984, vol. Sc-19, No. 6, pp. 820-827.

*Primary Examiner* — Lam T Mai
(74) *Attorney, Agent, or Firm* — McCoy Russell LLP

(57) ABSTRACT

[Problem] To shorten the measurement time, while maintaining the measurement precision, for a data converter of delta-sigma system.
[Solution] A measurement method of the present embodiment is a measurement method for a delta-sigma type of data converter that performs a data conversion between an analog signal and a digital signal. The measurement method comprises:
successively measuring and taking in output digital codes outputted via data conversions performed, by a data converter, on the basis of ramp-waveform inputs generated on the basis of input voltage values at predetermined intervals; selecting and pairing, as pair combinations, those ones of the output digital codes which are different from each other and further adjacent to each other in order of magnitude of value; performing, for each combination, a predetermined statistical processing by use of the output digital codes belonging to the combination or by use of the input voltage values
(Continued)

corresponding to these output digital codes; and calculating a nonlinear error from the result of the statistical processing.

17 Claims, 11 Drawing Sheets

(58) Field of Classification Search
USPC .................................................. 341/90–155
See application file for complete search history.

(56) References Cited

U.S. PATENT DOCUMENTS

| | | | | |
|---|---|---|---|---|
| 6,259,732 | B1* | 7/2001 | Lee | H04N 19/563 375/240 |
| 6,535,192 | B1* | 3/2003 | Sung | G09G 3/2011 345/94 |
| 7,027,635 | B1* | 4/2006 | Wihl | G03F 1/30 382/144 |
| 2003/0204793 | A1* | 10/2003 | Mellitz | G01R 29/26 714/700 |
| 2005/0099381 | A1* | 5/2005 | Park | G09G 3/3688 345/100 |
| 2011/0050705 | A1* | 3/2011 | Wada | G01R 31/31709 345/440.2 |
| 2012/0138775 | A1* | 6/2012 | Cheon | H04N 5/361 250/208.1 |
| 2014/0225760 | A1* | 8/2014 | Yang | H04N 5/335 341/155 |

FOREIGN PATENT DOCUMENTS

| | | |
|---|---|---|
| JP | P11-74789 A | 3/1999 |
| JP | P11-261417 A | 9/1999 |
| JP | P2004-88515 A | 3/2004 |
| JP | P2005-354617 A | 12/2005 |
| JP | P2006-319750 A | 11/2006 |

* cited by examiner

MEASUREMENT METHOD AND MEASUREMENT UNIT FOR DELTA-SIGMA TYPE DATA CONVERTER

CROSS REFERENCE TO RELATED APPLICATIONS

The present application is a U.S. National Phase of International Patent Application Serial No. PCT/JP2013/077868, entitled "MEASUREMENT METHOD, MEASUREMENT APPARATUS AND MEASUREMENT PROGRAM", filed on Oct. 13, 2013. International Patent Application Serial No. PCT/JP2013/077868 claims priority to Japanese Patent Application No. 2012-252602, filed on Nov. 16, 2012. The entire contents of each of the above-cited applications are hereby incorporated by reference in their entirety for all purposes.

BACKGROUND OF THE INVENTION

Field of the Invention

This invention relates to measuring method, measurement apparatus, and measurement program by using it, and more particularly for delta-sigma type AD converters and/or DA converters.

In late years, It is popular to use 16 bit or higher precision AD converter (ADC) or DA converter (DAC) (I call "Data converter" together) for instrumentations. For example, an approximate 20 bit DAC forces input voltages of a 16 bit ADC under test. Specifically the DAC forces analog output voltages corresponding to input data 0~1048575 (decimal) to the ADC under test sequentially. Then a measurement unit (MU) in measurement apparatus captures the ADC's digital outputs, stores into registers or memories, and calculates linearity, etc. Generally counting frequency of appearance and calculation operations, such as multiplication and division can be processed by microcomputer, having stored program. Simply it can be processed by high precision programmable power sources (corresponding to the DAC) and personal computer. Or in the industry, mixed-signal large-scale-integration-circuit (LSI) tester, which includes above functions, is generally used.

Related technology is disclosed in following non-patent literature 1. It describes ADC measurement method named "Histogram Method". "Histogram Method" is to force a ramp signal, whose voltage sequentially increases or decreases along time going, to an ADC under test, to capture digital output codes from the ADC under test, to make a accumulation table of frequency of digital code appearances from zero to full-scale, and to make second table which is divided by total appearances and multiplied by full-scale, an estimated conversion voltages corresponding to the output digital codes. There are patent documents 1~4, as additional related technology.

Prior Patent Document #1: JP2006-319750A
Prior Patent Document #2: JP2005-354617A
Prior Patent Document #3: JP2004-088515A
Prior Patent Document #4: JP11-261417A
Prior non-Patent literature #1:
Joey Doernberg et al., "Full-Speed Testing of A/D Converters", IEEE JOURNAL OF SOLID-STATE CIRCUITS, 1984, VOL.sc-19, NO. 6, pp. 820-827

Problem

However it takes a lot of time to keep measurement accuracy, when applying the method disclosed in the Prior non-Patent literature #1 to said delta-sigma type data converter.

The other problems and noble aspects will be described into EMBODIMENTS and DRAWINGS below.

BRIEF SUMMARY OF THE INVENTION

An embodiment of this invention is to make output digital code pairs, which are different and located in neighbor in order of value, to process certain statistic calculations to the output digital codes or input voltages corresponding to the output digital codes, and to calculate non-linearity errors with a result of the certain statistic calculations. Detail will be disclosed bellow.

AN ADVANTAGE OF THE INVENTION

The embodiment has an advantage to keep measurement accuracy, in addition, to shorten measurement time. Detail will be disclosed bellow.

DESCRIPTION OF THE REFERENCED EMBODIMENTS

I explain embodiments below to apply this invention, referring figures. In the figures, same elements have same symbols and may not be explained duplicate.

I may explain following embodiments divided to plural sections or plural embodiments, they are related together, such as modification of whole or part of other one, application example, detail explanation, supplemental explanation, etc., unless otherwise noted. In following EMBODIMENTS, explanations with certain numbers of elements are not limited to the exact numbers, unless otherwise noted or limited only the numbers in theory.

In the following embodiments, their components are not mandatory needed, unless otherwise noted or clear in theory. In addition, when I may explain a shape or positioning, etc. of the components (including operation steps) in the following embodiments, they include proximate or similar ones, unless otherwise noted or clear in theory.

Embodiment #1

Figure 1:
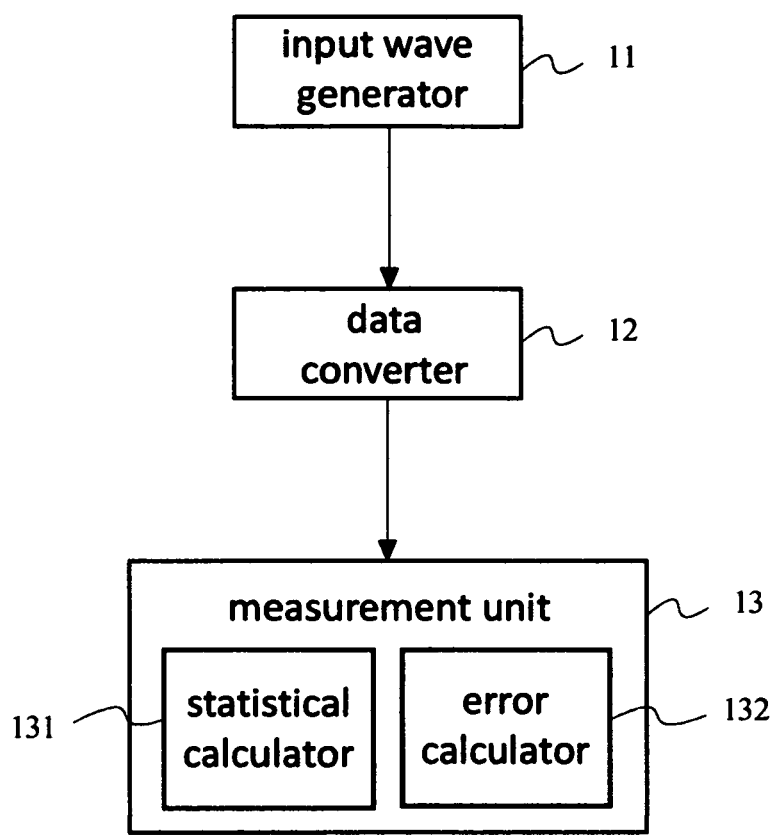
FIG. 1: Total architecture of measurement apparatus for data converter applying EMBODIMENT #1

FIG. 1 shows a block diagram of total architecture of measurement apparatus for data converter applying EMBODIMENT #1. FIG. 1 includes input wave generator 11, data converter 12, and MU 13. You can call "measurement unit" together with input wave generator 11 and MU 13. Input wave generator 11 generates ramp wave based on certain input voltage range, at least. Data converter 12 is a delta-sigma type ADC or DAC. In a case of ADC as Data Converter 12, input wave generator 11 includes DAC (not shown in FIG. 1), which converts digital ramp signal to analog signal and outputs to Data Converter 12. In a case of DAC as Data Converter 12, input wave generator 11 outputs digital ramp signal to Data Converter 12. In the case, MU 13 includes ADC (not shown in FIG. 1). In sum, Data converter 12 converts ramp wave, generated by input wave generator 11, as a DAC or DAC, and outputs the converted data to MU 13.

MU 13 has Statistic Calculator 131 and Error Calculator 132. Statistic Calculator 131 continuously captures the output digital data through Data converter 12 corresponding to the input ramp wave generated by ramp wave generator 11. Each output digital code is one of digital codes within the output range. Statistic Calculator 131 captures the output digital code along time line.

In a case that Data Converter 12 is an ADC, Statistic Calculator 131 captures the digital codes outputted from Data Converter 12. In a case that said Data Converter 12 is a DAC, an ADC, which is included in MU 13, converts the output of the Data Converter 12 to digital signals, and outputs them to Statistic Calculator 131. Statistic Calculator 131 captures the output digital signals from the ADC, which is included in MU 13.

Then Statistic Calculator 131 makes each output digital code pair, which are vary and located in neighbor in order of value. For example, in a case of 5, 5, 6, 5, 6, 6, 5, 6, 6, 7, 6, in captured order at decimal descriptions, Statistic Calculator 131 makes pair of 5 and 6 and pair of 6 and 7. Each of the pairs has "vary and located in neighbor in order of value". However the Statistic Calculator 131 doesn't make pairs, which locate in non-neighbor in of value such as 5 and 7. Statistic Calculator 131 doesn't make pairs, which have same value such as 5 and 5. Then Statistic Calculator 131 processes certain statistic calculations to the output digital codes or input voltages corresponding to the output digital codes per the pair. Here "certain statistic calculation" is calculation to compress noise in the output digital codes, such as zone average, moving average, or calculation based on approximate expression. Said "input voltages corresponding to the output digital codes per the pair" can be an input value corresponding to certain input value(s) or value processed to the plural input values with statistical calculations in case of plural input values. In above example, there are 4 output digital codes, which have code "5", it can be used an average, etc. of the input voltages corresponding to the output digital codes. The Error Calculator 132 calculates non-linearity error(s) from the result of Statistic calculator 131.

Figure 2:
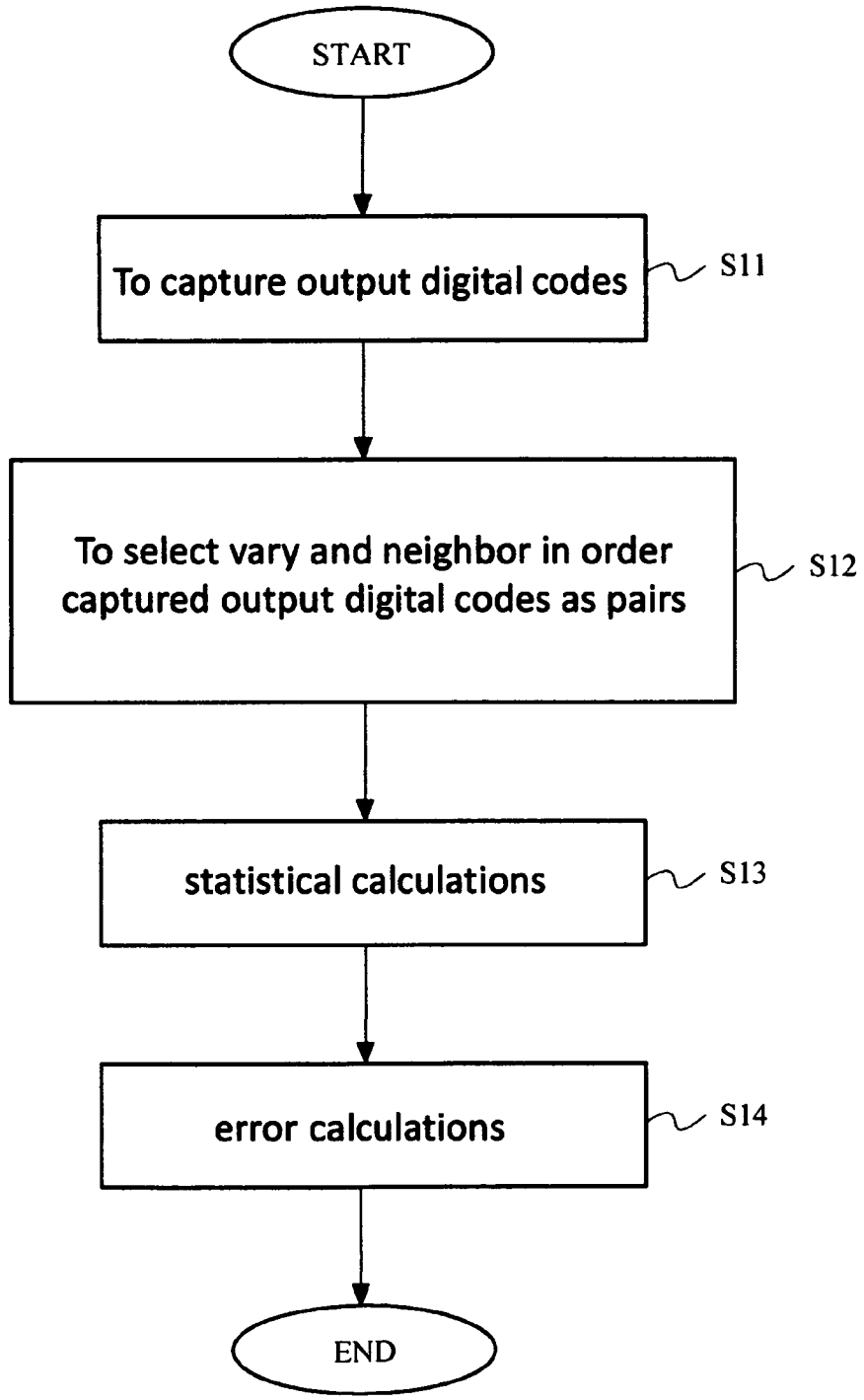
FIG. 2: A flowchart applying EMBODIMENT #1

FIG. 2 is a flowchart showing measurement process of EMBODIMENT #1. First, Statistic Calculator 131 captures output digital codes outputted from Data Converter 12 corresponding to input ramp wave generated based on input voltage values with certain step (S11). Then Statistic Calculator 131 makes each output digital code pair, which are different and located in neighbor in order of value (S12). Then Statistic Calculator 131 processes certain statistic calculations to the output digital codes or input voltages corresponding to the output digital codes per the pair (S13). Then the Error Calculator 132 calculates non-linearity error(s) from the result of Statistic calculator 131 (S14).

Problem is to take a lot of time to measure with certain accuracy, applying "histogram methodology" written in Prior non-Patent literature #1 for delta-sigma type ADC. Because of big noise, it is required to measure many times. For example, it is required to set step of ramp wave to $\frac{1}{10}$ of Least Significant Bit (LSB). It is similar situation to measure DAC.

Concretely, measurements for ADC or DAC with said "histogram methodology", the input is increasing monotonically. In cases of 16 bit ADC or DAC, 1 LSB=$\frac{1}{2^{16}}$=$\frac{1}{65536}$=0.000016. When full scale is 1V, 1 LSB is 16 μN. It is approximate noise level. In actual cases, noise may be 10 LSB peak-to-peak. It is needed many measuring points, such as 10~100 points per code, to reduce the noise effectively. Then long measurement time is needed.

MU under EMBODIMENT #1 can reduce noise, processing certain statistical calculate per pairs whose values are vary but nearest to reduce random noise. Due to lower noise, it can be accurate enough even if input voltage step is bigger. Then it can reduce measurement time without decreasing accuracy, at measurement for delta-sigma type data converter.

Embodiment #2

This embodiment is one of the EMBODIMENT #1 above. MU under EMBODIMENT #2 statistically calculates per zone, into which it divides output digital codes range. It helps to keep analog distortion reducing noise of output digital codes, to keep accuracy.

MU under EMBODIMENT #2 calculates first estimation values based on input voltages corresponding to output digital codes. MU calculates differences of the first estimation values per pair of output digital codes, and statistically calculates the differences of the first estimation values.

For example, in a case of delta-sigma type data converter under test, difference between neighbor output values is 1 least significant bit (LSB), and voltage steps of 1 LSB are commonly same 1 value, so that voltage differences of first estimation values can be compressed to 1 value to compress random noise. Then it can keep measurement accuracy with less random noise contribution, even to decease number of output digital codes.

In EMBODIMENT #2, second estimation values are accumulative values of results calculated statistically corresponding to digital code value positions. Second estimation values are recommended to use for calculation of non-linear errors. Then desired errors are easily calculated, and help analysis of measured data.

In addition, statistical calculation can be either zone average, moving average, or approximate expression in the EMBODIMENT #2. The statistical calculation reduces noise.

In the EMBODIMENT #2, the step can be bigger than output digital code 1 LSB. In the case, number of capturing data can be decrease, and measuring time can be reduced.

Figure 3:
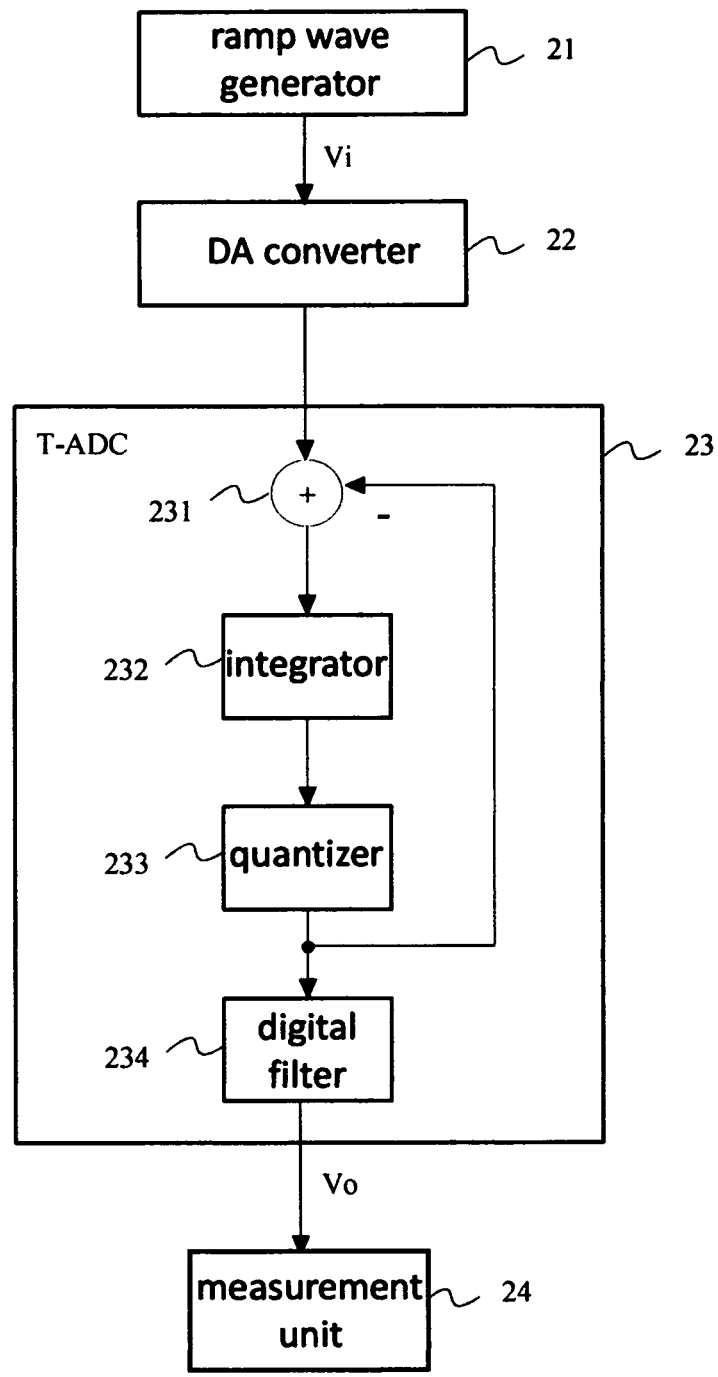
FIG. 3: A block diagram of measurement apparatus for delta-sigma type ADC applying EMBODIMENT #2

FIG. 3 shows a block diagram of whole MU for delta-sigma ADC. FIG. 3 includes ramp wave generator 21, DAC 22, T-ADC 23 and MU 24. Ramp wave generator 21 generates sequentially increasing or decreasing digital codes as ramp wave. DAC 22 is a high precision DAC, and converts the ramp wave generator 21's output, which is sequentially increasing or decreasing digital codes as ramp wave, to analog value. T-ADC 23 is a data converter under test with MU 24. MU 24 is a computing apparatus, which inputs digital output of T-ADC 23.

T-ADC 23 has subtracter 231, integrator 232, quantizer 233, and digital filter 234. Subtracter 231 subtracts feedback signal from input analog signal from DAC 22. Integrator 232 integrates the output from subtracter 232. Quantizer 233 quantizes output of integrator 232. Output of the quantizer 233 becomes said feedback signal.

Here the feedback signal is always 1 bit (2 values either 0 or 1), not depending on input. Actually integrated feedback signals during certain clocks is compared with input, then quantizer output becomes flip. It means that input voltage converts to clock number during flip of the quantizer. Digital filter 234 filters the quantized results to multi-bit, and outputs it to MU 24.

MU 24 calculate first estimation values of input voltages per output digital code, based on input voltage corresponding to digital output value. For example, (by using decimal description,) MU 24 calculates first estimation value of output digital code "5" by using plural input voltages, when MU 24 captured the plural date which shows code "5". As similar as above, MU 24 calculates first estimation value of output digital code "6".

And MU 24 calculates differences of the first estimation values of a pair of output digital codes per each combination. In a pair of output digital code combination case of "5" and "6", MU 24 calculates difference between the first estimation value of code "5" and he first estimation value of code "6". Similar as above, MU 24 calculates difference between the first estimation values of another code combinations.

Then MU 24 calculates statistical results by using the differences of the first estimation values. And MU 24 calculates second estimation values by accumulating the statistical results in order of the output digital codes, and calculates non linearity errors by using the second estimation values. In a case that captured output digital codes are "1", "2", "3", "4", "5", "6", and "7" . . . (decimal description), MU 24 calculates a second estimation value for code "5", by accumulating the statistical results of code "1", . . . "5".

Here, "statistical" means zoning average, moving average, and calculation with approximate expression, but not limited. It can be any other operation. MU 24 calculates statistical results by using captured digital codes corresponding to positions or frequency numbers of the captured digital codes, accumulates the statistical results up to each digital code as second estimation value of the code, and calculates non linearity errors, etc.

Figure 4:
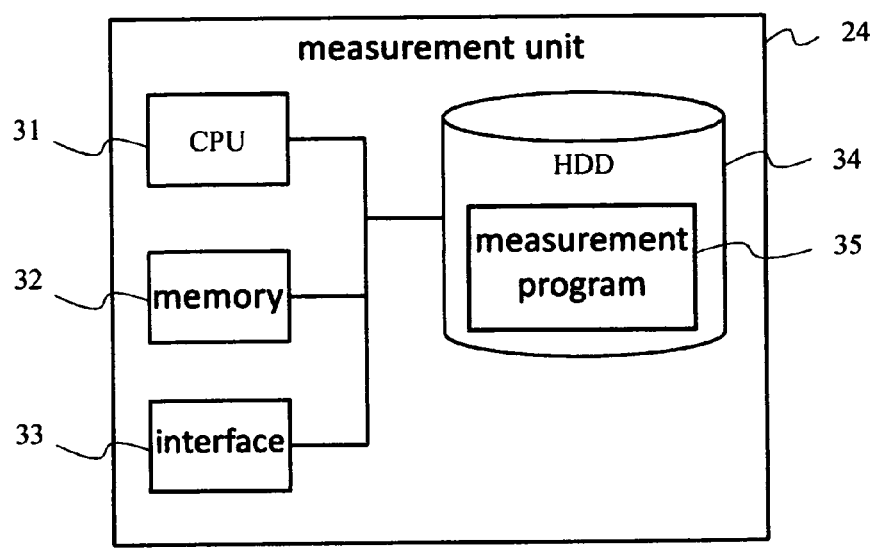
FIG. 4: An example of a block diagram applying EMBODIMENT #2

FIG. 4 shows one of MU block diagrams of second embodiment. MU 24 is a computer, consisting of central processing unit (CPU) 31, memory 32, and Hard disk drive (HDD) 34.

HDD 34 is a non-volatile memory device. HDD 34 memorizes operation system OS (not shown) and measurement program 35. Measurement procedure of the EMBODIMENT #2, such as shown in FIG. 5, is written into measurement program 35.

CPU 31 controls accesses, etc. of procedure of MU 24, memory 32 including Random access memory (RAM), interface (IF) 33, and HDD34. IF 33 communicates with outside of the computer, including capturing output digital codes from T-ADC 23.

In MU 24, CPU 31 reads OS and measurement program 35, and executes them. MU 24 can consist of CPU, data memory, instruction memory, in which measurement procedure is written, control circuits, etc. MU of EMBODIMENT #2 can be combined ramp wave generator 21, DAC 22, and MU 24. MU 24 can be a part of LSI tester.

Figure 5:
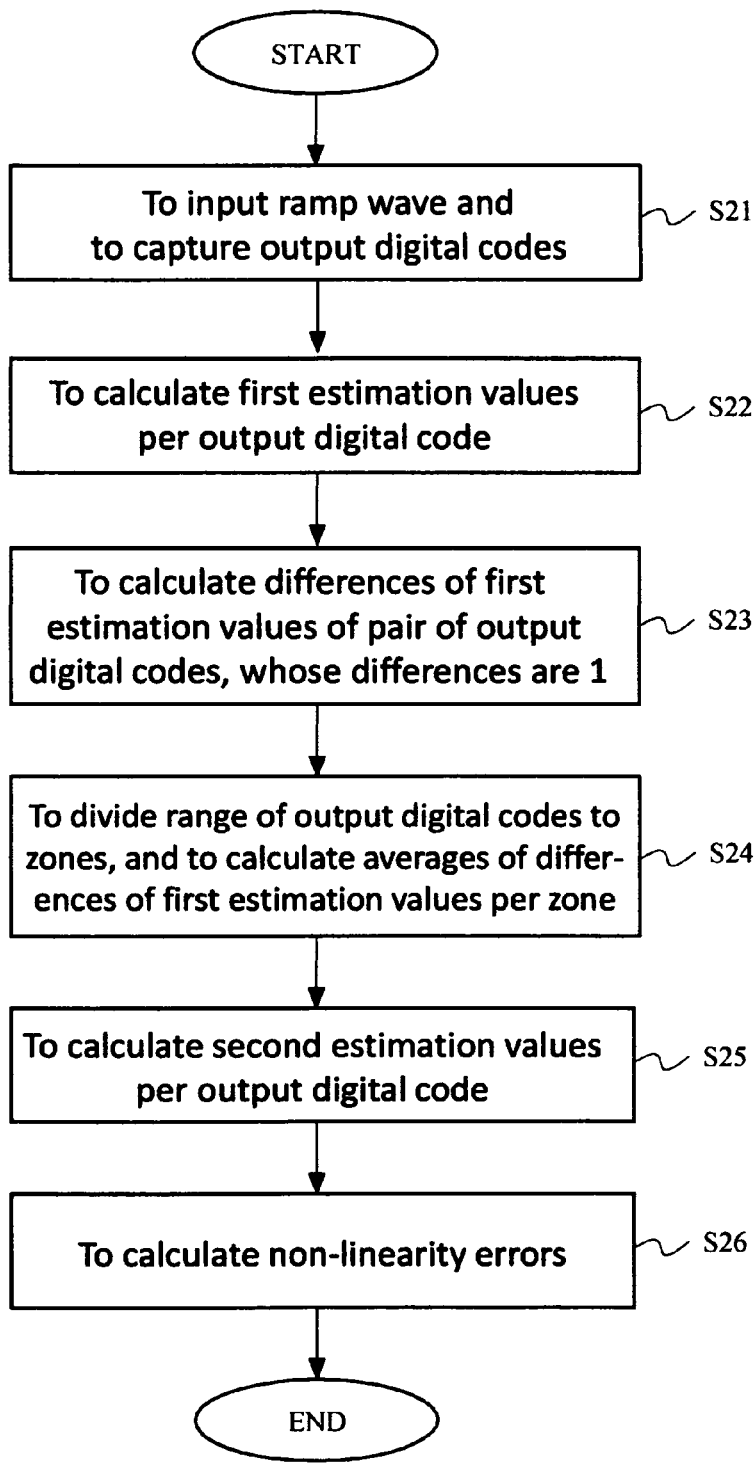
FIG. 5: A flowchart applying EMBODIMENT #2

FIG. 5 is a flowchart to explain measuring flow under EMBODIMENT #2. First, ramp wave generator 21 forces input digital signal Vi for DAC 22, which forces input analog signal to T-ADC 23. This time, ramp wave generator generates ramp wave with similar step as 1 LSB of output digital code. And MU 24 captures output digital codes of T-ADC 23 (S21).

Then, MU 24 calculates first estimation value per output digital code (S22). I.e. per the output digital code Vo, which is given by step S21, MU 24 calculates an average of input digital signals Vi, which is corresponding to the output digital code Vo. Then the average becomes the first estimation value of output digital code Vo. I.e. MU 24 estimates first estimation values of input digital signals Vi per output digital code Vo, based on input digital signals Vi corresponding to output digital code Vo. Calculation means for the first estimation values can be histogram method, which intend to numbers of code appearance frequencies.

For example, MU 24 calculates an average of input digital signals Vi, whose captured output digital codes are 1000000000000000 (binary) or 32768 (decimal). MU 24 calculates averages of input digital signals Vi per each output code similarly as the first estimation values.

Then MU 24 calculates differences of the first estimation value pairs, whose output digital codes have difference of 1 (S23). "The pairs whose output digital codes have difference of 1" is an example of "output digital code pair, which are vary and located in neighbor in order of value". To be more precise, MU 24 makes output digital code pairs, which are vary and located in neighbor in order of value. Then MU 24 calculates differences of the first estimation values per the output digital code pairs.

For example, output digital codes "n" and "n+1" are selected. MU 24 calculates a difference between a first estimation value calculated at step S22 for output digital code "n" and a first estimation value calculated at step S22 for output digital code "n+1". MU also calculates differences of all the other pairs of first estimation values.

Then, MU 24 divides range of output digital codes to plural zones, and then calculates average of said differences of first estimation values per the zone (S24). In the other words, MU processes statistical calculations for said differences of first estimation values. The each zone averages is a representing values per zone.

After that, MU 24 calculates second estimation values (S25). I.e. MU 24 accumulates said results of the statistical calculations, corresponding to output digital codes at code order, as second estimation values. In the other words, MU 24 accumulates each 1 LSB value, as average of said differences of first estimation values calculated in step S24, up to certain code. The accumulated values are second estimation values of the delta-sigma type ADC T-ADC23 under test. Second estimation values corresponding to either all digital codes or selected digital codes can be calculated.

Next, MU 24 calculates non linearity errors (S26). For example, MU 24 calculates differential non linearity errors (DNL) and integrated non linearity errors (INL) by using the second estimation values. Difference between 1 LSB value calculated in step S23 and ideal 1 LSB is exactly DNL. The ideal-1-LSB value can be calculated as an average of all 1 LSB values.

Here, each step of 1 LSB are theoretically same in delta-sigma type ADC under test. Said differences between first estimation values in step S23 are ideally always steps of 1 LSB. The inventors found that said differences between first estimation values include random noise and analog distortion by integrator or analog filter. Here, analog distortion is not highly fluctuate per output digital codes by codes, and smoothly depends on captured order of output digital codes. In EMBODIMENT #2, we propose to reduce random noise and not to reduce analog distortion.

In step 24, MU 24 processes statistical calculation to reduce random noise per zone, into which MU 24 divides range of output digital codes. For example, MU 24 simply averages said differences between first estimation values per zone as 1 LSB of delta-sigma ADC T-ADC 23 under test.

It is exemplified how to reduce random noise. Simply average of said differences are 1 LSB of ADC under test. Standard deviation of random noise becomes approximate $1/256$, which is square root of $1/65536$ in a case of 16 bit delta-sigma type ADC T-ADC 23 under test. Then 1 LSB calculated in step S24 include almost no noise. As it is well known that confidence interval proportions to standard deviation, above 1 LSB, which is reduced noise to $1/256$, is extremely close to true value.

For the other example, MU 24 divides 65536 output codes to 1024 zones, and calculate average of 64 said differences as a representing values per zone in step S24. As the result, standard deviation of random noise becomes $1/8$ per zone. Analog distortion is shown as sequential lines or approximate lines connected the representing values per zone. Hence MU 24 can calculate each 1 LSB during full range of output digital codes, reducing random noise and remaining analog distortion in step S24

In EMBODIMENT #2, let's discuss followings in a case of dividing 65536 output codes to 1024 zones, and calculating average of 64 said differences as a representing values per zone. In actual measurements of step S21, it may happen that certain output digital code(s) do(es) not appear by random noise during given capturing step, called "missing code(s)". When an output digital code is "missing code", MU 24 cannot calculate difference including the code in step 23. Then number of differences in the zone becomes 63 or less. Even if MU gets only 50 differences at very noisy condition, its standard deviation becomes approximate $1/7$. It means effectiveness of noise reduction is still excellent enough.

Based on the effectiveness, MU 24 selects 8 times bigger slope of input digital signal Vi of ramp wave generator. It makes conversion 1.25 times per 1 LSB of ADC T-ADC 23 under test.

In a previous case applying histogram method, 8 times of measurements per same output digital code is necessary to keep certain accuracy. In contrast, applying EMBODIMENT #2, one measurement per output digital code has been enough to get more than 50 differences. It means that noise reduction effectiveness is enough for the certain accuracy. In the case, measurement time can be $1/8$ of previous case, as well as reducing noise $1/7$.

As described above, MU 24 calculates averages of differences of first estimation values, corresponding a pair of output digital codes at combination of neighbor output digital codes in order in step S23 and S24. Here the average calculation volume can be reduced as follows.

In sum of differences between each neighbor data in a zone, all data are cancel out except both ends of the zone. Hence sum of differences between each neighbor data in a zone equals to only a difference of data located both ends. Average is the sum divided by data pieces. MU 24 may use moving averages instead of average in zone.

Calculations in step S25 can be reduced similar as above. Since the each average above is difference of data located both ends divided by data pieces, in accumulation of the averages, all data are also cancel out except approximate both ends. So the calculation can be executed non-canceled terms only.

In a case of moving average, since moving average of differences between neighbors is difference of data located both ends divided by data pieces, in accumulation of the moving averages, almost all data are also cancel out. So the calculation can be only final remained moving average.

Embodiment #3

EMBODIMENT #3 is the other embodiment of EMBODIMENT #1. At comparison between EMBODIMENT #3 and EMBODIMENT #2, MU calculates difference between a pair of output digital codes per combinations, and processes statistical calculations based on the difference between output digital codes. By the comparison, even if step of input signal Vi is more than 1 LSB, or difference between captured output digital codes is more than 2 LSB, MU can calculate input voltage per 1 LSB divided by the difference. It can reduce more measurement time, keeping similar measurement accuracy.

For example, MU 24 can select slope of ramp input digital signal Vi, depending on measuring condition and delta-sigma type ADC T-ADC23 under test, and earn to shorten measurement time.

The other portions can be same or similar as EMBODIMENT #2, and get same or similar effects. So that I skip duplicate explanation and figures.

Figure 6:
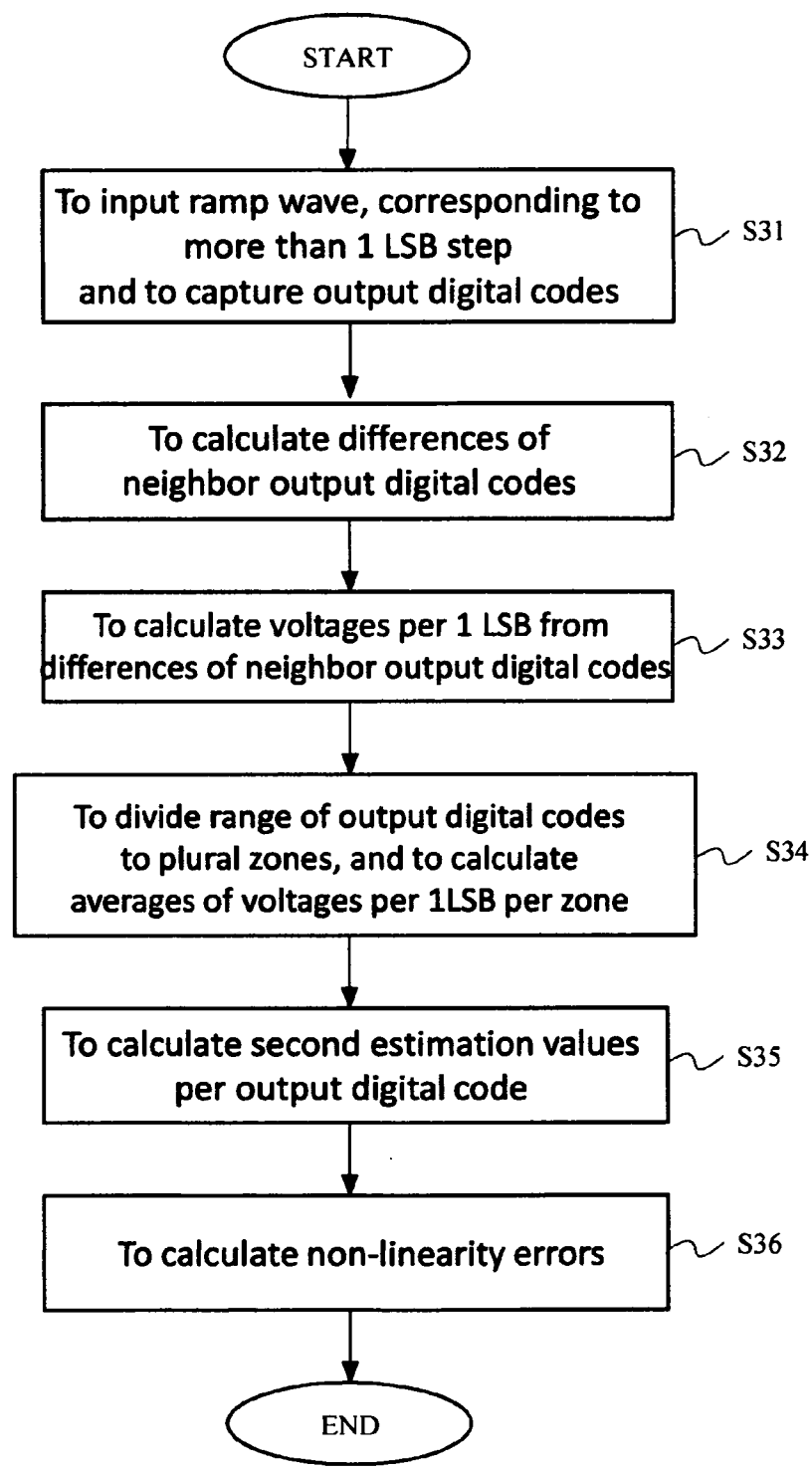
FIG. 6: A flowchart applying EMBODIMENT #3

FIG. 6 is a flowchart to explain EMBODIMENT #3. First of all, ramp wave generator 21 inputs an analog ramp wave, which has more than 1 LSB step, to T-ADC25 through DAC 22. Then MU 24 captures output digital codes Vo from T-ADC23 (S31). By the operation, MU 24 can reduce measurement points. In the case, "neighbor codes" in captured output digital codes from delta-sigma type ADC T-ADC23 are not 1 LSB anymore.

Then MU 24 calculates differences between neighbor output digital codes (S32). Due to less measurement points than EMBODIMENT #2, it may be possible not to capture plural outputs per output digital codes. It may be possible that differences of captured output digital codes equals or more than 2. Then MU 24 calculates voltage per 1 LSB (S33). To be more precise, MU 24 calculates (step voltage of ramp wave)/(difference of captured neighbor output digital codes) as voltage per 1 LSB. Since "step voltage of ramp wave" is a constant, it can be multiplied in bulk.

After that, MU 24 divides output range of output digital codes into zones, and calculates average of said voltage per 1 LSB (S34). Then MU 24 processes step S35 and S36 similar as S25 and S26 in FIG. 5.

For example, in step S31, in a case of 16 bit delta sigma type ADC T-ADC23, ramp wave with only 300 measurement points (quite larger voltage step than 1 LSB) is forced to T-ADC23, MU 23 captures every 65536/300=approximate 218 codes. Actuary captures it with random noise and analog distortion.

As explained above, in step S32 and S33, MU 24 calculates "voltages per 1 LSB". In step S34, MU 24 divides full range of output digital codes to (i.e. 14) zones, and calculates zone-average of 16 "voltages per 1 LSB" per zone. In step 35, MU24 accumulates the zone averages as second estimation values. In step S36, MU 24 calculates non linearity errors. Instead of zone average, moving average of 16 data, or approximate coefficient calculation can be applicable.

As the result, noise standard deviation in the averages become ¼ (=square root of ¹/₁₆). Even only 300 measuring points, which is ¹/₂₁₈₄ measurement time than previous measurement method, realize ¼ noise than previous measurement method, as well as to describe analog distortion. They are extremely advantages.

Embodiment #4

EMBODIMENT #4 is one of EMBODIMENT #1, and modified EMBODIMENT #3. In EMBODIMENT #4, MU calculates inverse number of difference between a pair of output digital codes per combinations, and processes statistical calculations based on the inverse number of difference between output digital codes. By the comparison, even if step of input signal Vi is more than 1 LSB, MU can keep similar measurement accuracy, simplify calculation, and process high-speed statistical calculation. Especially it is faster than EMBODIMENT #3.

Similar as EMBODIMENT #3, MU 24 can select slope of ramp input digital signal Vi, depending on measuring condition and delta-sigma type ADC T-ADC23 under test, and earn to shorten measurement time than EMBODIMENT #2.

The other portions can be same or similar as EMBODIMENT #2, and get same or similar effects. So that I skip duplicate explanations and figures.

Figure 7:
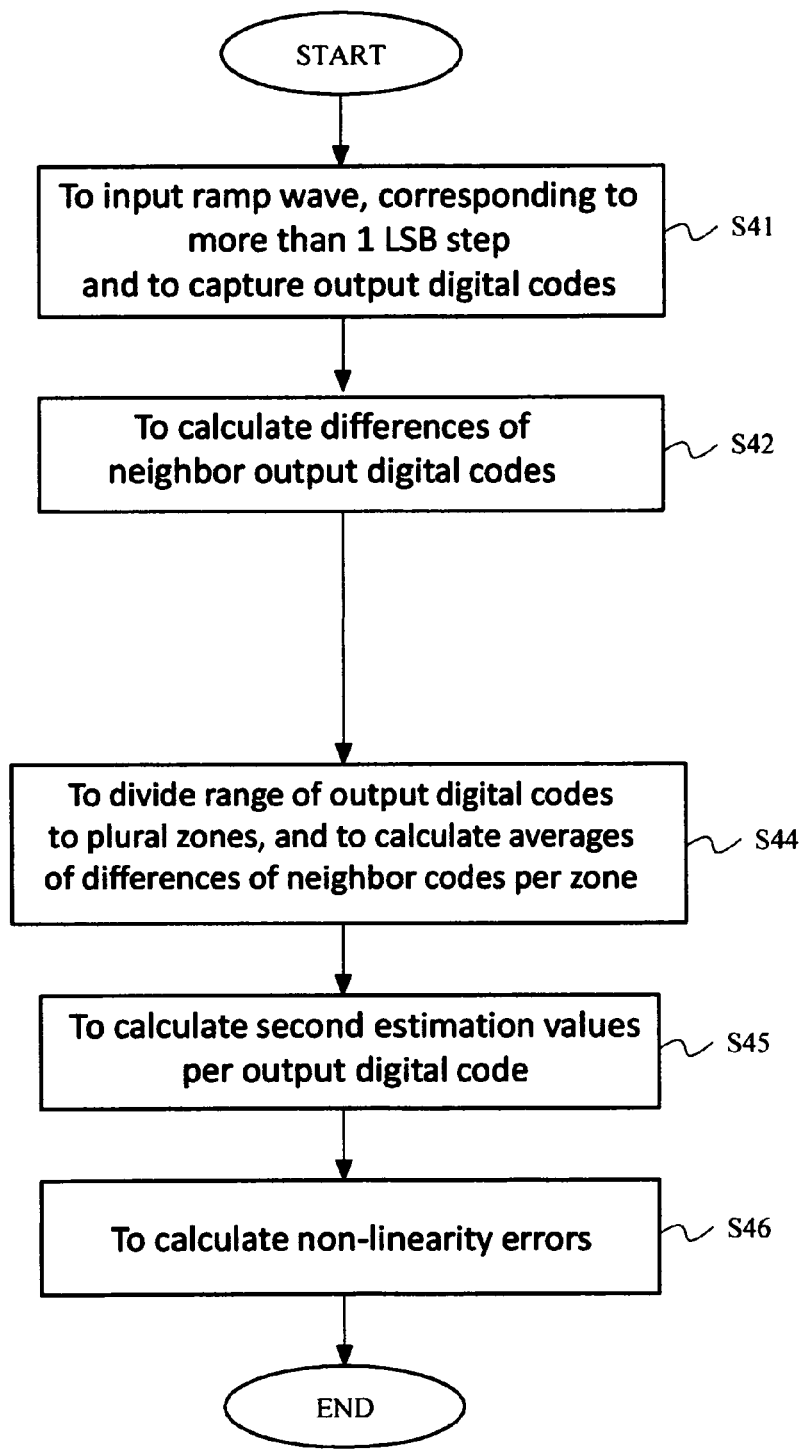
FIG. 7: A flowchart applying EMBODIMENT #4

FIG. 7 is a flowchart to explain EMBODIMENT #4. Step S41 and S42 are similar as said step S31 and S32. Now I introduce new dimension of inverse number of 1 LSB. Inverse number of "Voltage per 1 LSB" in EMBODIMENT #3 is 1/(1 LSB)=(difference between captured neighbor codes)/(step of ramp wave). Since "step of ramp wave" is a constant, it can be calculated together at final stage. Hence "difference between captured neighbor codes" per step of ramp wave can be calculated digitally in S62 in FIG. 7. Step S33 in FIG. 6 can be omitted. Division calculations are omitted than EMBODIMENT #3, total calculation volume is less.

Since theoretically all 1 LSB have similar values, all 1/(1 LSB) is also similar. Defining x as error from true value, 1/(1+x) can be approximate 1−x. In dimension inversed number of 1 LSB, sign of errors are inversed from dimension of 1 LSB.

Next, MU 24 divides range of output digital codes into plural zones, and calculates averages of differences between neighbor codes per zone (S44). It is that averages of dimension of inverse numbers of 1 LSB. Then MU 24 accumulates inverse numbers of the averages as second estimation values (S45). As described in 0068, MU 24 accumulates the averages as second estimation values without inverse calculations. In the case, at non-linearity error calculations (S46), signs of the errors are ignored even flipped, because usually total non-linearity error calculations are calculated absolute of worst case of each non-linearity error.

Embodiment #5

Embodiment #5 is an embodiment of EMBODIMENT #1, and modified EMBODIMENT #4. In EMBODIMENT #5, MU calculates tentative non-linearity errors corresponding to pair of output digital codes per combinations, then processes statistical calculation of the tentative non-linearity errors. These calculations earn to keep measurement accuracy even bigger input voltage step than 1 LSB, to simplify statistical calculations, and speed up calculations, especially higher speed than EMBODIMENT #3 and #4. Here, it is ok to apply previous histogram method shown above for calculations of the tentative errors. The tentative errors are not final errors such as S14 in FIG. 2. The tentative errors are intermediate results to calculate final errors. EMBODIMENT #5 is 2 stage error calculation method. In the first stage, MU calculates previous style non-linearity errors as tentative errors applying previous method. Then in the second stage, MU calculates final non-linearity errors based on the tentative errors.

Measurement time can be reduced than EMBODIMENT #2, selecting slope of input digital signal of ramp wave proprietary corresponding to measurement conditions and delta-sigma ADC under test as same as EMBODIMENT #3 and #4.

The other portions can be same or similar as EMBODIMENT #2, and get same or similar effects. So that I skip duplicate explanation and figures.

Figure 8:
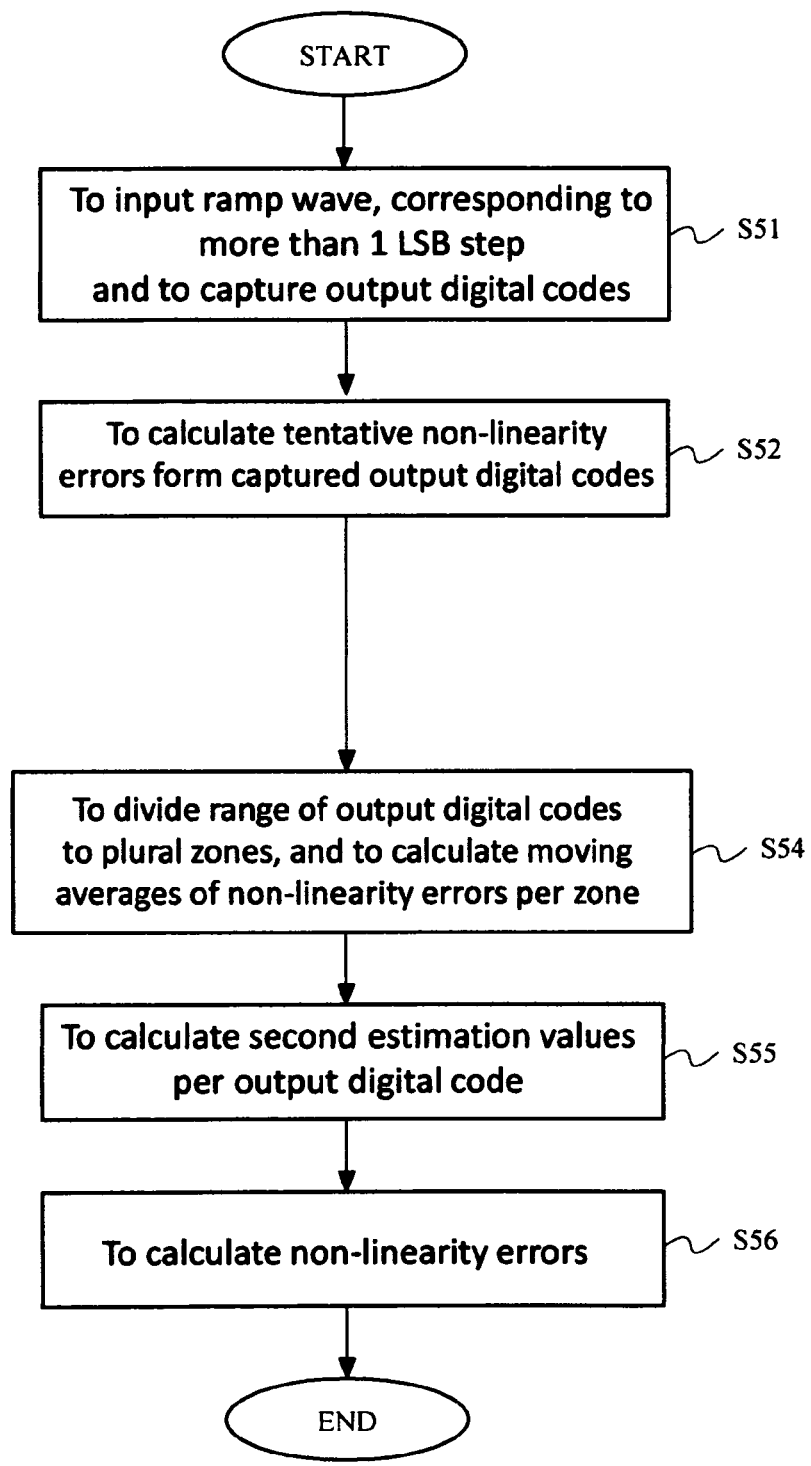
FIG. 8: A flowchart applying EMBODIMENT #5

FIG. 8 is a flowchart to explain measurement process of EMBODIMENT #5. Step S51 is similar as above step S31 and S41. Next, MU 24 calculates tentative non-linearity errors from captured output digital codes (S52). From the output digital codes, which include noise, MU 24 calculates tentative non linearity errors applying previous method. Then MU 24 divides range of output digital codes to plural zones, and calculates moving averages of tentative non-linearity errors per zone (S54). Here in step S54, MU 24 processes statistical calculation, such as average to reduce random noise. After that, MU 24 processes steps S55 and S56 similar as steps S25 and S26.

Here I explain that Steps S52 and S53 are equivalent to Steps S42 and S43. As above description, DNL is difference between neighbor data minus constant value. "average of {(difference between neighbor data)·(constant value)} and "(average of difference between neighbor data)−(constant value)" must equal without calculation orders. Then FIG. 7 and FIG. 8 are equivalent.

INL is give as (ramp input voltage)−(ideal input voltage of ideal input voltage) per code. Let's consider moving average in the zone. Since ideal input voltage is given as linear function of code, its average is always median, which is constant. Moving average of "ramp input voltages" is equivalent to the moving average in EMBODIMENT #2.

Hence, as same as FIGS. 6 and 7, procedure that MU 24 calculates tentative non-linearity error first then moving average has excellent advantages with reduced measurement time of only 300 measurement points, and approximate ¼ noise in averages then previous method, as well as keeping analog distortion.

As described above, previous histogram method requires approximate 10 times measurements of all 65536 codes, or 655360. Method in EMBODIMENT #5 realizes approximate ¹/₂₀₀₀ times of previous histogram method.

Figure 9:
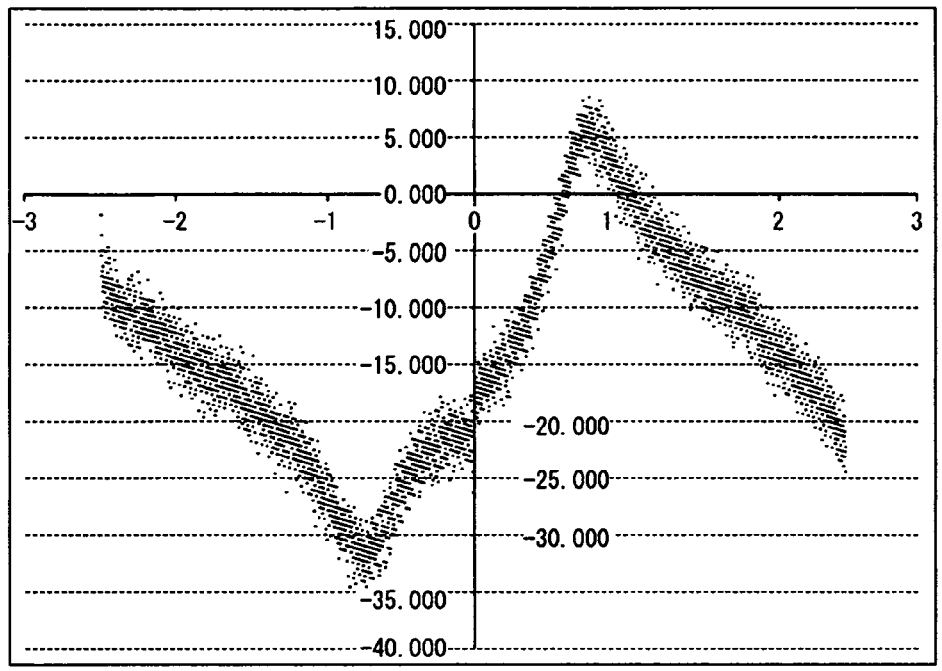
FIG. 9: A graph of integrated non-linearity error (INL) including approximate 2500 measurement points applying prior method

FIG. 9~12 are graphs of measured data. In FIG. 9~12, each x axis shows input step voltage, and each y axis shows errors from ideal voltages of ADC under test. FIG. 9 shows INL at approximate 2500 measurement points applying method described in Prior non-Patent literature #1. It includes random noise, and integrated non-linearity error is calculated with the noisy output digital codes.

Figure 10:
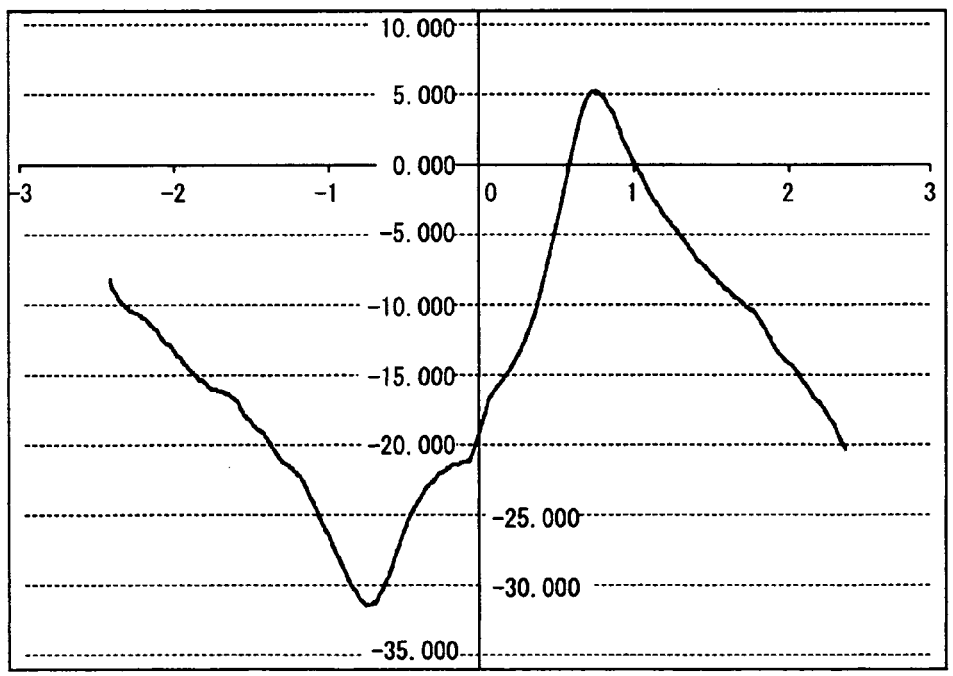
FIG. 10: A graph of INL reduced noise, including approximate 2500 measurement points applying EMBODIMENT #5

FIG. 10 is a graph of INL of approximate 2500 measured data, applying EMBODIMENT #5. It is a graph of noise-reduced INL in S54. Each points are located middle of noise, and they should be close of true value without noise.

Figure 11:
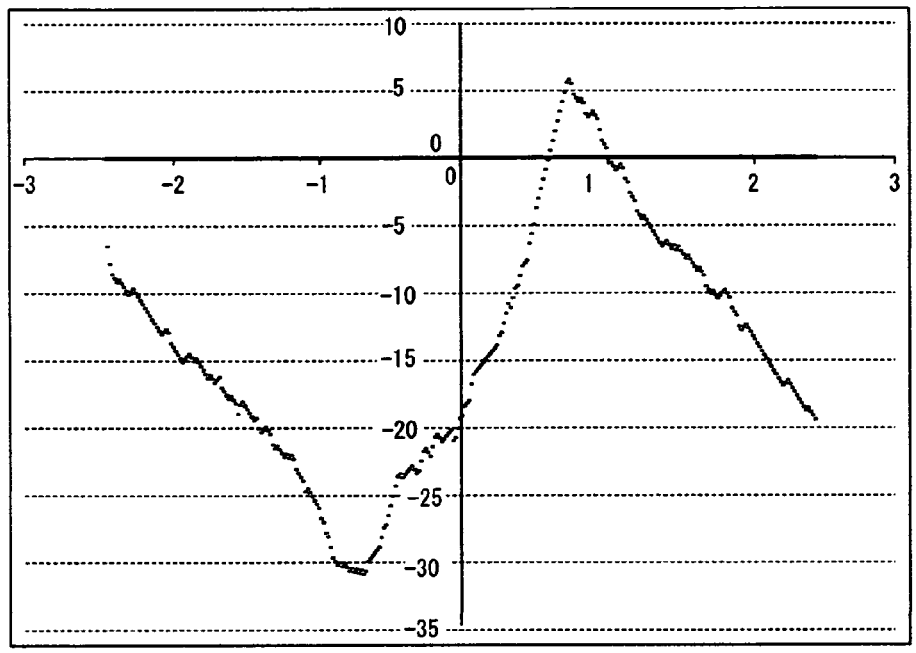
FIG. 11: A graph of INL reduced noise, including approximate 250 measurement points applying EMBODIMENT #5

FIG. 11 is a graph of noise-reduces INL at approximate 250 measurement points. It is applied step S52 and S54.

Figure 12:
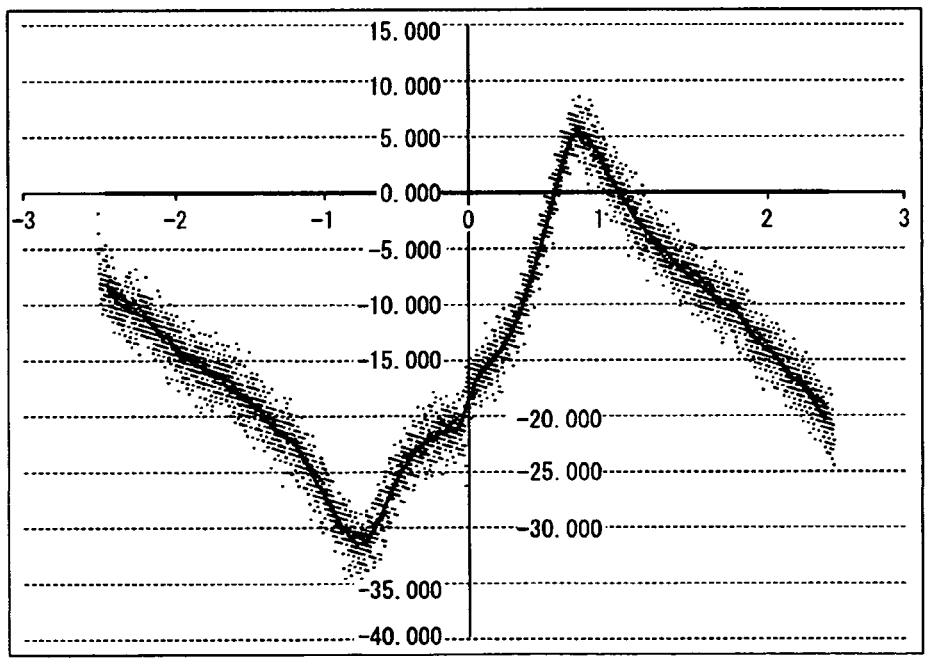
FIG. 12: graphs overlaid with FIG. 9~FIG. 11 to compare them

FIG. 12 is overlaid with FIG. 9~11 to compare them. Result of FIG. 11 is almost same as FIG. 10. Each points in FIG. 12 are located middle of noise, and they are close of true value without noise.

Concluding above, in Prior non-Patent literature #1, FIG. 9 shows integrated non-linearity of 2500 measurement points, which is every 14 of all 65536 codes. It is similar as all 65536 data. FIGS. 10 and 11 show accurate, close to true value without noise, with only 250 measurement points, applying EMBODIMENT #5. It shows availability of measurement time reduction. In addition, FIGS. 10 and 11 still keeps analog distortions. It means keeping accuracy.

Flowchart in FIG. 8 shows histogram method to calculate non-linearity errors for data converters disclosed in Prior non-Patent literature #1, followed by moving average calculation to reduce random noise. Generally it was well known that this kind of calculation makes low accuracy due to reduce non-linearity errors themselves also. However, as explained above, FIG. 8 and FIG. 7 are equivalent. And this is very useful method, which reduces random noise, but does not reduce non-linearity errors. Hence measurement method applying EMBODIMENT #5 can keep measurement accuracy and reduce measurement time.

Embodiment #6

EMBODIMENT #6 is an embodiment of EMBODIMENT #1, and modified EMBODIMENT #2. It is measurement method for delta-sigma type DAC. In the case, it has similar effects as EMBODIMENT #2~#5.

Figure 13:
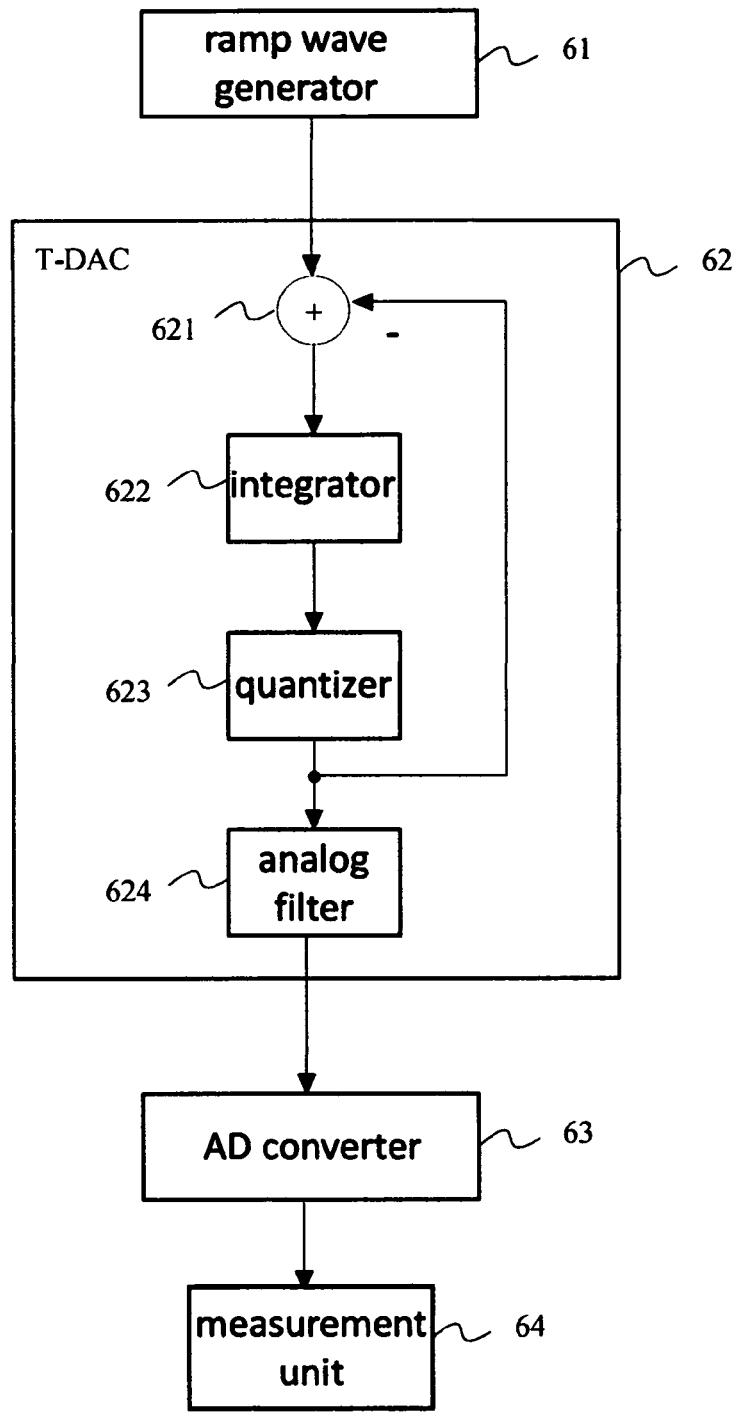
FIG. 13: A block diagram of measurement apparatus for delta-sigma type DAC applying EMBODIMENT #6

FIG. 13 is a whole block diagram of measurement apparatus for delta-sigma type DACs applying EMBODIMENT #6. FIG. 13 includes ramp wave generator 61, T-DAC 62, ADC 63, and MU 64. DAC 22 in FIG. 1 is converted to delta-sigma type DAC T-DAC 62 under test in FIG. 13, and delta-sigma type ADC T-ADC 23 under test in FIG. 1 is converted to precision reference ADC 63 in FIG. 13. Difference ADCs and DACs in FIG. 1 and FIG. 13 are which is under test and which is for reference.

T-DAC 62 includes subtracter 621, integrator 622, quantizer 623, and analog filter 624. 1 LSB of delta-sigma type DAC T-DAC 62 is theoretically same anywhere, similar as T-ADC 23. MU 64 captures output digital codes added by random noise and analog distortion.

Assuming that "digital codes" mean input digital codes for ramp wave generator 61, and "voltages" mean output voltages corresponding to ADC 63 outputs, MU 64 can reduce random noise and measurement time, processing flowcharts in FIG. 5~8.

Other Embodiments

As described above, measurement unit and measurement method, Which apply one of EMBODIMENT #1~#6, can reduce random noise during measurement. And they can measure extremely accurately less noise. In addition, they can reduce measurement time, because they can reduce noise than previous even reducing measurement points. They are very useful for testing of LSI manufacturing. When they can be apply to measurement for correction data of data converters, which become popular to include error correction system in them, the correction can be accurate and speedy.

In addition to embodiments above for delta-sigma type ADC and DA C, I explain following embodiments: for example, there are other types of ADC and DAC, such as resistor strings type, unit current type, unit capacitor type, etc. They respectively and sequentially added approximate same physical values, such as resistances, currents, capacitances, etc. Since each error of the physical values are small enough than 1 piece or 1 LSB, the physical values are almost same. So it is possible to reduce bigger noise than 1 LSB, applying above embodiments. Proposed method can apply to many kind of ADCs and DACs, and many kind of physical values. Proposed method can be widely applicable, not limited to examples above.

In embodiments of this invention, the measurement unit or measurement method calculates statistically differences between unit physical values of data converters under test to reduce noise standard deviations. They are widely applicable.

As a summary, I re-describe Embodiments above as follows:

(1) An accuracy measurement method for either ADC or DAC by using:
  said DAC given sequentially increasing or decreasing digital input codes;
  said ADC, which converts output voltage of said DAC to digital codes;
  and an computing unit, which sequentially captures output digital codes of said ADC, and calculates said captured output digital codes;
  wherein said measurement method:
  which calculates first estimation values of conversion voltages at said captured output digital codes, corresponding to position or frequency of said captured output digital codes;
  which statistically calculates difference between said first estimation values, corresponding to pair of output digital codes, which have difference of "1";
  and which accumulates results of said statistical calculations up to each output digital codes' position as second estimation values.

(2) Another measurement method:
  By using a DAC given sequentially increasing or decreasing digital input codes;
  an ADC, which converts output voltage of said DAC to digital codes;
  and an computing unit, which sequentially captures output digital codes of said ADC, and calculates said captured output digital codes;
  an accuracy measurement method for either said ADC or said DAC:
  which statistically calculates difference or difference of inverse numbers between pair of vary and neighbor in order said captured output digital codes;
  and which accumulates results of said statistical calculations up to each output digital codes' position as estimation values.

(3) The other measurement method:
  By using a DAC given sequentially increasing or decreasing digital input codes;
  an ADC, which converts output voltage of said DAC to digital codes;
  and an computing unit, which sequentially captures output digital codes of said ADC, and calculates said captured output digital codes;
  an accuracy measurement method for either said ADC or said DAC:
  which calculates first non-linearity errors from said captured output digital codes;
  and which statistically calculates said first non-linearity errors as second non-linearity errors.

(4) In one of measurement methods (1)~(3),
said statistical calculations are based on zone averages, moving averages, or approximate expressions.

(5) Measurement program, which is executed in computer, for data converter, which converts between analog and digital;
which sequentially captures output digital codes through data conversion by said data converter(s), corresponding to ramp wave inputs generated by input voltages with certain step;
which makes pairs of vary and neighbor in order said output digital codes;
which statistically calculates said pairs of output digital codes or input voltages corresponding to said output digital codes;
and which calculates non-linearity errors by using said statistical calculation.

This invention is not limited to said embodiments, and it can be modified variously within substances described above. For example, not only hardware described in said embodiments, but not limited. The method can be realized by executing computer program in CPU (Central Processing Unit).

In the case, the program is stored in various types of non-transitory computer readable mediums, and is supplied to computer. Non-transitory computer readable mediums include various types of tangible storage mediums. Examples of tangible storage mediums include magnetic recording mediums (flexible disc, magnetic tape, hard disc drive, etc.), magnetic optical mediums (e.g. magnetic optical disc), CD-ROM (Read Only Memory), CD-R, CD-R/W, DVD (Digital Versatile Disc), BD (Blue-Ray Disc), semiconductor memory (mask ROM, PROM (Programmable ROM), EPROM (Erasable PROM), Flash ROM, RAM (Random Access Memory)). Program can be supplied by transitory computer readable mediums. Examples of transitory computer readable mediums include electrical signal, optical signal, and electromagnetic wave. Transitory computer readable mediums can supply program through wired communication paths such as electric cables or optical fibers, or wireless communication paths.

I have explained this invention concretely based on embodiments, but not limited described said embodiments, and it can be modified variously within substances described above.

BRIEF DESCRIPTION OF THE DRAWINGS 11 input wave generator
12 data converter
13 measuring unit
131 statistical calculator
132 error calculator
21 Ramp wave generator
22 DA converter
23 T-ADC
231 subtracter
232 integrator
233 quantizer
234 digital filter
24 measurement unit (MU)
31 CPU
32 memory
33 interface unit
34 HDD
35 measurement program
61 Ramp wave generator
62 T-DAC
621 subtracter
622 integrator
623 quantizer
634 analog filter
63 AD converter
64 measuring unit
Vi input digital signal
Vo output digital code

What is claimed is:
1. A measurement method for a delta-sigma type data converter, which converts data between an analog domain and a digital domain, wherein said measurement method comprises:
sequentially capturing output digital codes through data conversion by said data converter, corresponding to ramp signal inputs generated by certain step input voltages;
making pairs of variable and neighbor output digital codes in order in said output digital codes;
processing statistical calculations by using said output digital codes or input voltages corresponding to said output digital codes;
calculating non-linearity errors from said statistical calculations;
calculating differences between pairs of said output digital codes per pair; and
processing said statistical calculations for differences between pairs of said output digital codes.

2. The measurement method described in claim 1, wherein said measurement method further comprises:
calculating first estimation values of input voltages, corresponding to said output digital codes, per said output digital codes;
calculating differences between said first estimation values, corresponding to pairs of said output digital codes, per pair; and
processing statistical calculations for said first estimation values.

3. The measurement method described in claim 1, wherein said measurement method further comprises:
calculating inverse numbers of differences between pairs of said output digital codes per pair; and
processing statistical calculations for said inverse numbers of differences between pairs of said output digital codes.

4. The measurement method described in claim 2, wherein said measurement method further comprises:
accumulating results of said statistical calculations, corresponding to positions of said output digital codes, in order, as second estimation values; and
calculating said non-linearity errors by using said second estimation values.

5. The measurement method described in claim 2, wherein said measurement method further comprises:
processing said statistical calculations per zone, into which a total range of said output digital codes is divided.

6. The measurement method described in claim 1, wherein said measurement method further comprises:
using either zone averages, moving averages, or approximate expressions as statistical calculations.

7. The measurement method described in claim 1, wherein:
certain steps of said ramp signal inputs are bigger than 1 LSB (Least Significant Bit) of said output digital codes.

8. An accuracy measurement method for an AD converter or a DA converter, comprising:
- a DA converter, which sequentially increases or decreases digital input codes;
- an AD converter, which converts output voltage of said DA converter to digital codes; and
- a computing unit, which sequentially captures output digital codes of said AD converter, and calculates said captured output digital codes;
- wherein said measurement method further comprises:
  - calculating first estimation values of conversion voltages at said captured output digital codes, corresponding to positions or frequencies of said captured output digital codes;
  - statistically calculating differences between said first estimation values, corresponding to pairs of output digital codes, which have a difference of; and
  - accumulating results of said statistical calculations for each output digital code's position, as second estimation values.

9. A measurement unit, which converts data between an analog domain and a digital domain, wherein said measurement unit comprises:
- a statistical calculation unit, wherein said statistical calculation unit:
  - sequentially captures output digital codes through data conversion by a data converter, which correspond to ramp wave inputs generated by input voltages with a certain step;
  - makes pairs of variable and neighbor in order said output digital codes; and
  - statistically calculates said pairs of output digital codes or input voltages corresponding to said output digital codes; and
- an error calculation unit, wherein said error calculation unit:
  - calculates non-linearity errors from results of said statistical calculations;
  - calculates differences between pairs of said output digital codes per pair; and
  - processes statistical calculations of said differences between said output digital codes.

10. The measurement unit described in claim 9, wherein said statistical calculation unit:
- calculates first estimation values of input voltages corresponding to said output digital codes;
- calculates differences between said first estimation values, corresponding to pairs of output digital codes; and
- processes statistical calculations of said differences between said first estimation values.

11. The measurement unit described in claim 9, wherein said statistical calculation unit:
- calculates inverse numbers of differences between pairs of said output digital codes, per pair; and
- processes statistical calculations of said inverse numbers of differences between pairs of said output digital codes.

12. The measurement unit described in claim 9, wherein said statistical calculation unit:
- calculates tentative non-linearity errors corresponding to pairs of said output digital codes, per pair; and
- processes statistical calculations of said tentative non-linearity errors.

13. The measurement unit described in claim 9, wherein said statistical calculation unit:
- accumulates results of said statistical calculations, corresponding to positions of said output digital codes, as second estimation values; and
- calculates said non-linearity errors by using said second estimation values.

14. The measurement unit described in claim 10, wherein said statistical calculation unit:
- processes said statistical calculations per zone, into which a total range of said output digital codes is divided.

15. The measurement unit described in claim 9, wherein said statistical calculation unit:
- processes statistical calculations using zone averages, moving averages, or approximate expressions.

16. The measurement unit described in claim 9, wherein said certain step is bigger than 1 LSB (Least significant Bit).

17. A measurement method for a delta-sigma type data converter, which converts data between an analog domain and a digital domain, wherein said measurement method comprises:
- sequentially capturing output digital codes through data conversion by said data converter, corresponding to ramp signal inputs generated by certain step input voltages;
- making pairs of variable and neighbor output digital codes in order in said output digital codes;
- processing statistical calculations by using said output digital codes or input voltages corresponding to said output digital codes;
- calculating non-linearity errors from said statistical calculations;
- calculating tentative non-linearity errors from pairs of said output digital codes per pair; and
- processing said statistical calculations from said tentative errors.

* * * * *